(12) United States Patent
Pan

(10) Patent No.: US 7,554,311 B2
(45) Date of Patent: Jun. 30, 2009

(54) HYBRID CHARGE PUMP REGULATION

(75) Inventor: Feng Pan, Richmond, CA (US)

(73) Assignee: SanDisk Corporation, Milpitas, CA (US)

( * ) Notice: Subject to any disclaimer, the term of this patent is extended or adjusted under 35 U.S.C. 154(b) by 295 days.

(21) Appl. No.: 11/497,465

(22) Filed: Jul. 31, 2006

(65) Prior Publication Data
US 2008/0024096 A1 Jan. 31, 2008

(51) Int. Cl.
G05F 1/00 (2006.01)

(52) U.S. Cl. .................. 323/285; 323/275; 323/280; 323/284

(58) Field of Classification Search .................. 323/282, 323/271, 274, 275, 280, 284, 285; 327/536, 327/538, 540, 351
See application file for complete search history.

(56) References Cited

U.S. PATENT DOCUMENTS

| | | | |
|---|---|---|---|
| 4,752,699 A | 6/1988 | Cranford, Jr. et al. | |
| 5,029,282 A | 7/1991 | Ito | |
| 5,053,640 A | 10/1991 | Yum | |
| 5,373,477 A | 12/1994 | Sugibayashi | |
| 5,596,532 A | 1/1997 | Cernea et al. | |
| 5,625,544 A | 4/1997 | Kowshik et al. | |
| 5,631,547 A | 5/1997 | Fujioka et al. | |
| 5,704,875 A * | 1/1998 | Tanabe ........................... 482/4 |
| 5,796,296 A | 8/1998 | Krzentz | |
| 5,883,501 A | 3/1999 | Arakawa | |
| 5,946,258 A | 8/1999 | Evertt et al. | |
| 5,978,283 A | 11/1999 | Hsu et al. | |
| 6,041,012 A | 3/2000 | Banba et al. | |
| 6,091,282 A | 7/2000 | Kim | |
| 6,107,862 A | 8/2000 | Mukainakano et al. | |
| 6,259,612 B1 | 7/2001 | Itoh | |
| 6,297,687 B1 | 10/2001 | Sugimura | |
| 6,320,797 B1 | 11/2001 | Liu | |
| 6,404,274 B1 | 6/2002 | Hosono et al. | |
| 6,424,570 B1 | 7/2002 | Le et al. | |
| 6,434,044 B1 | 8/2002 | Gongwer et al. | |
| 6,456,155 B2 | 9/2002 | Takai | |
| 6,459,328 B1 | 10/2002 | Sato | |

(Continued)

FOREIGN PATENT DOCUMENTS

WO    WO 99/49576    9/1999

OTHER PUBLICATIONS

Final Rejection mailed Oct. 19, 2007 in U.S. Appl. No. 11/303,387.

(Continued)

Primary Examiner—Jessica Han
Assistant Examiner—Emily Pham
(74) Attorney, Agent, or Firm—Davis Wright Tremaine LLP

(57) ABSTRACT

Techniques for reliably and efficiently generating an output voltage for use within an electronic device, such as a memory system, are disclosed. A voltage generation circuit generates the output voltage. The voltage generation circuit includes regulation circuitry that controls regulation of the output voltage to maintain the output voltage at a substantially constant level. According to one aspect, regulation is provided through use of different feedback circuits. By selectively disabling one of the feedback circuits, power consumption can be reduced and the other of the feedback circuits can support the continued regulation of the output voltage. The voltage generation circuit is therefore able to operate in an accurate, stable and power efficient manner.

33 Claims, 5 Drawing Sheets

U.S. PATENT DOCUMENTS

| | | | |
|---|---|---|---|
| 6,529,437 | B2 | 3/2003 | Kono |
| 6,549,064 | B2 | 4/2003 | Bandy et al. |
| 6,577,535 | B2 | 6/2003 | Pasternak |
| 6,605,986 | B2 | 8/2003 | Tanzawa et al. |
| 6,661,682 | B2 | 12/2003 | Kim et al. |
| 6,760,262 | B2 | 7/2004 | Haeberli et al. |
| 6,841,981 | B2 | 1/2005 | Smith et al. |
| 6,922,096 | B2 | 7/2005 | Cernea |
| 6,922,098 | B2 | 7/2005 | Choi et al. |
| 6,995,605 | B2 * | 2/2006 | Hazucha et al. ............ 327/551 |
| 7,120,058 | B2 | 10/2006 | Seo et al. |
| 7,304,871 | B2 | 12/2007 | Ito et al. |
| 2002/0089317 | A1 | 7/2002 | Khouri et al. |
| 2005/0030771 | A1 | 2/2005 | Conte et al. |
| 2006/0125451 | A1 | 6/2006 | Tabaian et al. |
| 2006/0267673 | A1 | 11/2006 | Gan et al. |
| 2007/0030749 | A1 | 2/2007 | Pyeon et al. |

OTHER PUBLICATIONS

Written Opinion dated Dec. 6, 2007 in PCT Application No. PCT/US2007/017043.
International Search Report dated Dec. 6, 2007 in PCT Application No. PCT/US2007/017043.
Office Action dated May 2, 2007 received in related application, U.S. Appl. No. 11/303,387.
Office Action dated Mar. 1, 2007 received in related application, U.S. Appl. No. 11/295,906.
Office Action dated Jun. 4, 2007 received in related application, U.S. Appl. No. 11/303,569.
Final Rejection dated Aug. 16, 2007 received in related application, U.S. Appl. No. 11/295,906.
International Search Report dated Aug. 2, 2007 in Application No. PCT/US2007/007648.
Notice of Allowance dated Jan. 9, 2008 in U.S. Appl. No. 11/303,569.
Notice of Allowance dated Jan. 9, 2008 in U.S. Appl. No. 11/523,875.
Office Action dated May 14, 2008 in U.S. Appl. No. 11/303,387.

* cited by examiner

HYBRID CHARGE PUMP REGULATION

CROSS REFERENCE TO RELATED APPLICATION

This application is related to U.S. patent application Ser. No. 11/303,387, entitled "CHARGE PUMP REGULATION FOR IMPROVED POWER EFFICIENCY", and filed Dec. 16, 2005, and which is hereby incorporated by reference herein.

BACKGROUND OF THE INVENTION

1. Field of the Invention

The invention relates to voltage generation and, more particularly, to voltage generation internal to memory systems.

2. Description of the Related Art

Memory cards are commonly used to store digital data for use with various products (e.g., electronics products). Examples of memory cards are flash cards that use Flash type or EEPROM type memory cells to store the data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Sunnyvale, Calif.

FIG. 1 is a schematic diagram of a first conventional voltage generation circuit 100. The conventional voltage generation circuit 100 can provide one or more generated voltages to a memory system that provides non-volatile data storage and represents, for example, a memory card (e.g., flash card). The voltage generation circuit 100 includes a charge pump circuit 102. The charge pump circuit 102 operates to boost a lower input voltage (Vin) to produce a higher output voltage (Vout). The output voltage is coupled to a decoupling capacitor ($C_D$) 104. The output voltage is also coupled to a resistive divider 106. The resistive divider 106 divides the output voltage using resistors R1 and R2. A comparator 108 couples to the resistive divider 106 and to a reference voltage (Vref). The output of the comparator 108 is fed back to the charge pump circuit 102 so that the charge pump circuit 102 can regulate the output voltage so that it remains at a substantially constant voltage level.

FIG. 2 is a schematic diagram of a second conventional voltage generation circuit 200. The conventional voltage generation circuit 200 is generally similar to the conventional voltage generation circuit 100 except that instead of using a resistive divider 106, a capacitive divider 202 is used. The output voltage of the charge pump circuit 102 is coupled to the capacitive divider 202. The capacitive divider 202 divides the output voltage using capacitors C1 and C2. The comparator 108 couples to the capacitive divider 202 and to the reference voltage (Vref). The output of the comparator 108 is fed back to the charge pump circuit 102 so that the charge pump circuit 102 can regulate the output voltage so that it remains at a substantially constant voltage level.

Unfortunately, however, a resistive divider consumes substantial amounts of power. The power consumption is particularly problematic when being used with power conscious electronic devices, such as battery-powered electronic devices. Although a capacitive divider is power efficient, it is not adequately stable given its sensitivity to process variations, parasitic wiring and resistor-capacitor variations and junction leakage currents.

Accordingly, there is a need for improved voltage generation circuits that are not only stable but also power efficient.

SUMMARY OF THE INVENTION

Broadly speaking, the invention relates to techniques for reliably and efficiently generating an output voltage for use within an electronic device, such as a memory system providing data storage. A voltage generation circuit generates the output voltage. The voltage generation circuit includes regulation circuitry that controls regulation of the output voltage to maintain the output voltage at a substantially constant level. According to one aspect of the invention, regulation is provided through use of different feedback circuits. By selectively disabling one of the feedback circuits, power consumption can be reduced and the other of the feedback circuits can support the continued regulation of the output voltage. The voltage generation circuit is therefore able to operate in an accurate, stable and power efficient manner.

The voltage generation circuit is particularly well suited for use in a memory product. For example, the voltage generation circuit can be provided within a portable data storage device (e.g., memory card) to generate an internal voltage.

The invention can be implemented in numerous ways, including as a method, system, device or apparatus. Several embodiments of the invention are discussed below.

A voltage generation circuit according to one embodiment of the invention includes at least: a voltage producing circuit that receives an input voltage and outputs an output voltage at an output terminal, and the voltage producing circuit having a control terminal; a comparison circuit operatively connected to the voltage producing circuit, the comparison circuit operating to compare a feedback signal received at an input terminal with a reference signal to produce a feedback signal that is supplied to the control terminal of the voltage producing circuit; a first feedback circuit operatively connected to the output terminal of the voltage producing circuit and to the comparison circuit, the first feedback circuit providing a first feedback signal to the input terminal of the comparison circuit; and a second feedback circuit operatively connected to the output terminal of the voltage producing circuit and to the comparison circuit, the second feedback circuit providing a second feedback signal to the input terminal of the comparison circuit.

A voltage generation circuit according to another embodiment of the invention includes at least: a charge pump circuit that receives an input voltage and outputs an output voltage at an output terminal, the output voltage being derived from the input voltage, and the charge pump circuit having a control terminal; a resistive divider operatively connected to the output terminal of the charge pump circuit to provide a first divided voltage at a first node; a capacitor divider operatively connected to the output terminal of the charge pump circuit to provide a second divided voltage at a second node; a comparator operatively connected to the second node and to a reference voltage, the comparator comparing the first divided voltage or the second divided voltage to the reference voltage to produce a first control signal that is supplied to the control terminal of the charge pump circuit; a first switch operatively connected between the first node and the second node; and a second switch operatively connected between the resistive divider and an established voltage (e.g., ground).

A memory product according to one embodiment of the invention includes at least: data storage elements; a controller for performing data storage and retrieval with respect to the data storage elements; and at least one voltage generation circuit. The voltage generation circuit includes at least: a charge pump circuit that receives an input voltage and outputs an output voltage at an output terminal, the output voltage being derived from the input voltage, and the charge pump circuit having a control terminal; a resistive divider operatively connected to the output terminal of the charge pump circuit to provide a first divided voltage at a first node; a capacitor divider operatively connected to the output terminal of the charge pump circuit to provide a second divided voltage at a second node; a comparator operatively connected to the second node and to a reference voltage, the comparator comparing the first divided voltage or the second divided voltage to the reference voltage to produce a first control signal that is supplied to the control terminal of the charge pump circuit; a first switch operatively connected between the first node and the second node; and a second switch operatively connected between the resistive divider and an established voltage.

An electronic system according to one embodiment of the invention includes at least: a data acquisition device; and a data storage device removably coupled to the data acquisition device. The data storage device stores data acquired by the data acquisition device. The data storage device includes at least: data storage elements; a controller for performing data storage and retrieval with respect to the data storage elements; and at least one voltage generation circuit. The at least one voltage generation circuit receives an input voltage and outputs an output voltage at an output terminal, the output voltage being derived from the input voltage. The voltage generation circuit including at least: a comparison circuit operating to compare a feedback signal received at an input terminal with a reference signal to produce a feedback signal that is supplied to the voltage generation circuit; a first feedback circuit providing a first feedback signal to the input terminal of the comparison circuit; and a second feedback circuit providing a second feedback signal to the input terminal of the comparison circuit.

A method for regulating a voltage level produced by a voltage generation circuit of a voltage control circuit according to one embodiment of the invention includes at least: activating the voltage control circuit that produces a regulated output voltage, the voltage control circuit including at least a first feedback circuit and a comparison circuit; enabling a second feedback circuit; determining whether the output voltage has reached its regulated level; and disabling the second feedback circuit when it is determined that the output voltage has reached the regulated level, whereby regulation of the output voltage is through the second feedback circuit.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to techniques for reliably and efficiently generating an output voltage for use within an electronic device, such as a memory system providing data storage. A voltage generation circuit generates the output voltage. The voltage generation circuit includes regulation circuitry that controls regulation of the output voltage to maintain the output voltage at a substantially constant level. According to one aspect of the invention, regulation is provided through use of different feedback circuits. By selectively disabling one of the feedback circuits, power consumption can be reduced and the other of the feedback circuits can support the continued regulation of the output voltage. The voltage generation circuit is therefore able to operate in an accurate, stable and power efficient manner.

In one embodiment, a voltage generation circuit can utilize a plurality of feedback circuits. Typically, these feedback circuits are connected in parallel and have different characteristics. For example, one of the feedback circuits might use a resistive feedback approach, while another of the feedback circuits might use a capacitive feedback approach. Given that multiple feedback circuits with different characteristics are being used together, the voltage generation circuit that uses such feedback circuits can be referred to as a hybrid voltage generation circuit.

The voltage generation circuit is particularly well suited for use in a memory product. For example, the voltage generation circuit can be provided within a portable data storage device (e.g., memory card) to generate an internal voltage.

Embodiments of this aspect of the invention are discussed below with reference to FIGS. 3-8C. However, those skilled in the art will readily appreciate that the detailed description given herein with respect to these figures is for explanatory purposes as the invention extends beyond these limited embodiments.

Figure 1:
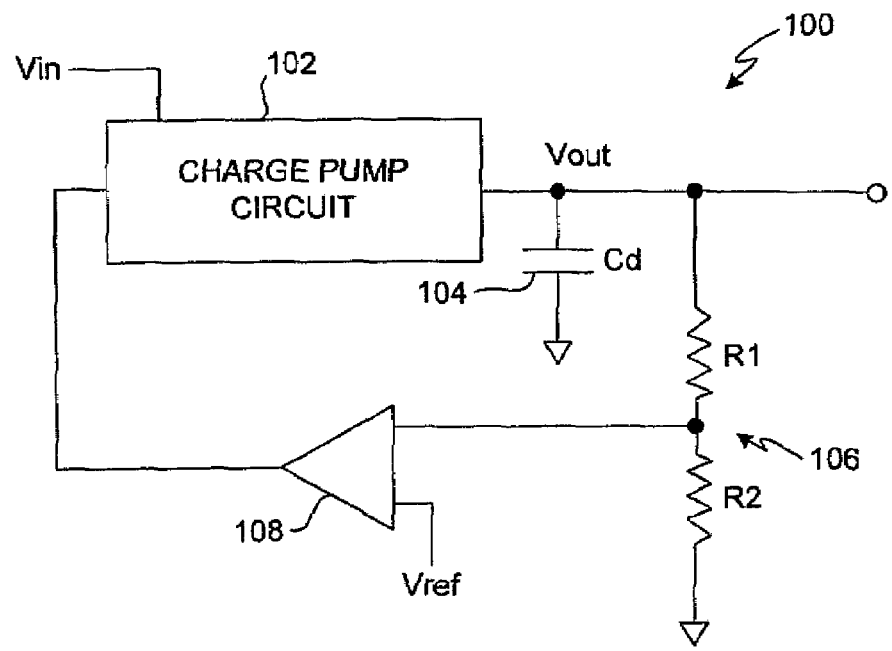
FIG. 1 is a schematic diagram of a first conventional voltage generation circuit.
Figure 2:
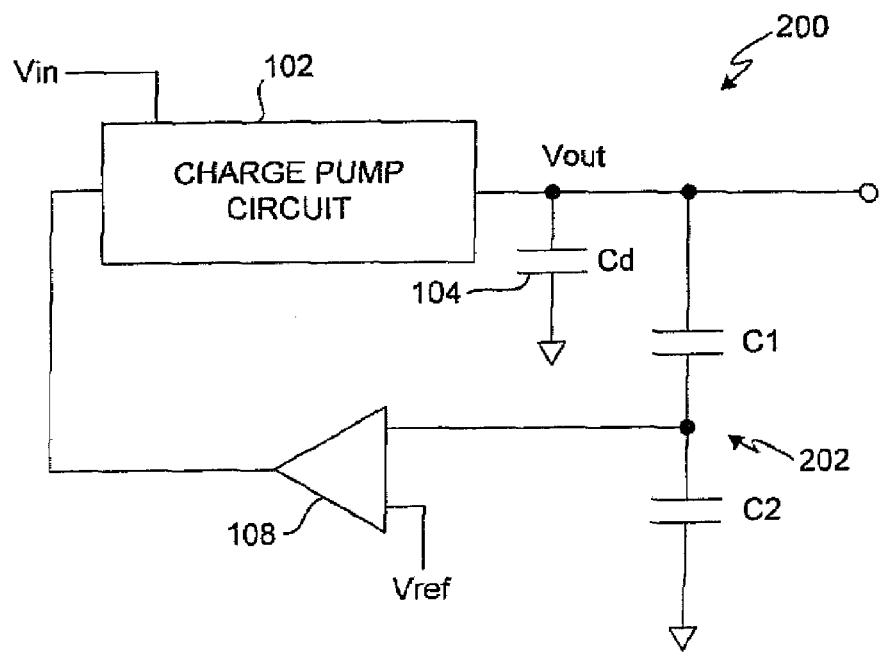
FIG. 2 is a schematic diagram of a second conventional voltage generation circuit.
Figure 3:
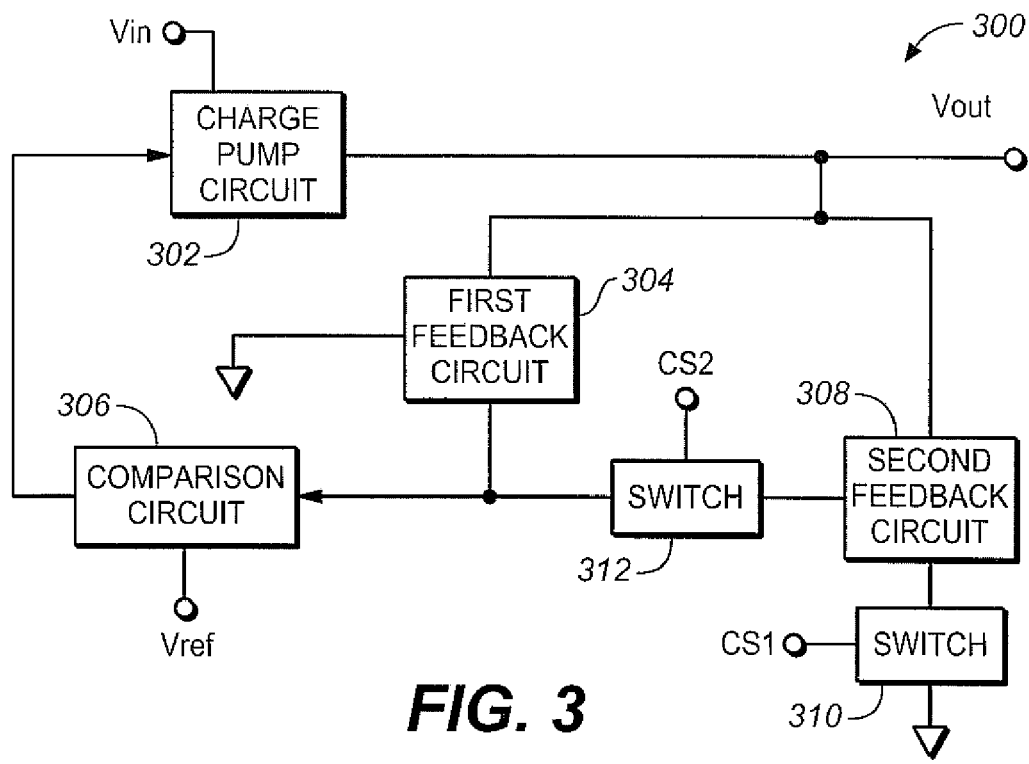
FIG. 3 is a schematic diagram of a voltage generation circuit according to one embodiment of the invention.

FIG. 3 is a schematic diagram of a voltage generation circuit 300 according to one embodiment of the invention. The voltage generation circuit 300 includes a charge pump circuit 302. The charge pump circuit 302 receives an input voltage (Vin) and outputs a derived output voltage (Vout). The output voltage (Vout) can be higher or lower than the input voltage (Vin). The voltage generation circuit 300 also includes regulation circuitry (or feedback circuitry). In this embodiment, the regulation circuitry includes a first feedback circuit 304, a comparison circuit 306, and a second feedback circuit 308. In addition, the voltage generation circuit 300 also includes a first switch 310 and a second switch 312.

The first feedback circuit 304 is coupled between the output voltage(Vout) from the charge pump circuit 302 m-td ground. The input voltage (Vin) and the groined voltage potentials are normally provided by a power supply or battery. Further, the first feedback circuit 304 provides a first feedback signal to a first input terminal of the comparison circuit 306. A second input terminal of the comparison circuit 306 receives a reference voltage (Vref). The second feedback circuit 308 is coupled between the output voltage (Vout) from the charge pump circuit 302 and the first switch 310. The first switch 310 controls whether the second feedback circuit 308 couples to ground. The first switch 310 is controlled by a first control signal (CS1). The second feedback circuit 308 is provides a second feedback signal to the second switch 312. The second switch 312 controls whether the second feedback signal is supplied to the first input terminal of the comparison circuit 306. The second switch 312 is controlled by a second control signal (CS2).

During operation of the voltage generation circuit 300, the comparison circuit 306 receives either the first feedback signal or both the first feedback signal and the second feedback signal at the first input terminal of the comparison circuit 306. Regardless of whether the first feedback signal or both the first feedback signal and the second feedback signal are received at the first input terminal, the comparison circuit 306 compares the resulting input signal with the reference voltage (Vref). Based on the comparison, the comparison circuit 306 outputs a control signal that is supplied to a control terminal of the charge pump circuit 302. The control signal is utilized by the charge pump circuit 302 to regulate the output voltage (Vout) such that it is maintained at a specified voltage level plus or minus some permitted tolerance. The control signal serves to control the charge pump circuit 302 so that the output voltage (Vout) of the charge pump circuit 302 is regulated so as to maintain the output voltage level at the specified voltage level even in the presence of loads being applied or removed from the output terminal of the charge pump circuit 302.

In one embodiment, the voltage generation circuit 300 serves to regulate the output voltage (Vout) from the charge pump circuit 302 through use of the first feedback circuit 304 as well as the second feedback circuit 308. In this embodiment, the first feedback circuit 304 is active to produce a first feedback signal. In addition, the second feedback circuit 308 is active to produce a second feedback signal. The first switch 310 and the second switch 312 are used to activate or deactivate the second feedback circuit 308. More particularly, the first and second switches 310 and 312 are "on" when the second feedback circuit 308 is active, and the first and second switches 310 and 312 are "off" when the second feedback circuit 308 is inactive.

Advantageously, the second feedback circuit 308 of the voltage generation circuit 300 can be enabled or disabled as appropriate. The first switch 310 is controlled to enable/disable the second feedback circuit 308. When enabled, the second feedback circuit 308 participates in the voltage regulation. When disabled, the second feedback circuit 308 is effectively isolated from participating in the voltage regulation such that it does not provide any feedback signal to the comparison circuit 306. Moreover, when disabled, the power consumed or dissipated by the second feedback circuit 308 is substantially reduced (or even eliminated). However, even when the second feedback circuit 308 is disabled, the first feedback circuit 304 continues to support continued voltage regulation. Accordingly, the voltage generation circuit 300 is capable of operating such that the output voltage (Vout) of the charge pump circuit 302 can be achieved in not only an accurate, reliable and stable manner but also with substantially improved power efficiency.

Figure 4:
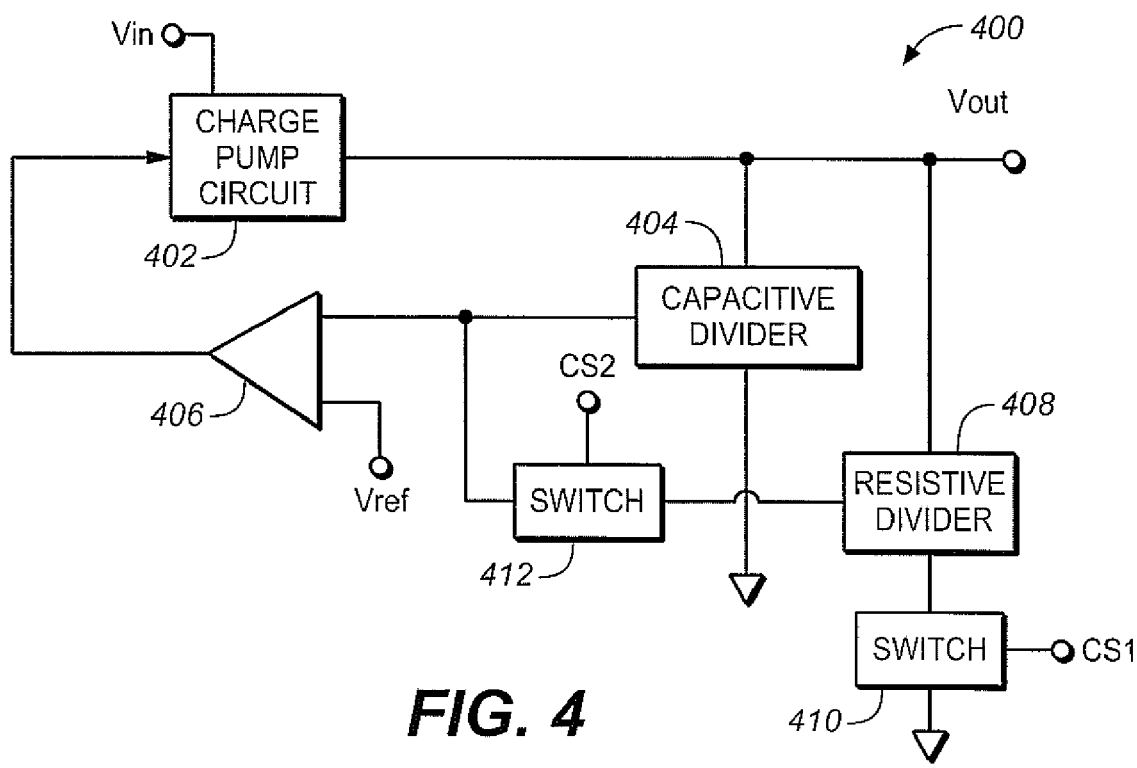
FIG. 4 is a schematic diagram of a voltage generation circuit according to another embodiment of the invention.

FIG. 4 is a schematic diagram of a voltage generation circuit 400 according to another embodiment of the invention. The voltage generation circuit 400 includes a charge pump circuit 402. The charge pump circuit 402 receives an input voltage (Vin) and outputs a derived output voltage (Vout). The output voltage (Vout) can be higher or lower than the input voltage (Vin). The voltage generation circuit 400 also includes regulation circuitry (or feedback circuitry). In this embodiment, the regulation circuitry includes a capacitive divider 404, a comparator 406, and a resistive divider 408. In addition, the voltage generation circuit 400 also includes a first switch 410 and a second switch 412.

The capacitive divider 404 is coupled between the output voltage (Vout) from the charge pump circuit 402 and ground. The input voltage (Vin) and the ground voltage potentials are normally provided by a power supply or battery. Further, the capacitive divider 404 provides a first feedback voltage to a first input terminal of the comparator 406. A second input terminal of the comparator 406 receives a reference voltage (Vref). The resistive divider 408 is coupled between the output voltage (Vout) from the charge pump circuit 402 and the first switch 410. The first switch 410 controls whether the resistive divider 408 couples to ground. The first switch 410 is controlled by a first control signal (CS1). The resistive divider 408 provides a second feedback voltage to the second switch 412. The second switch 412 controls whether the second feedback voltage is supplied to the first input terminal of the comparator 406. The second switch 412 is controlled by a second control signal (CS2).

During operation of the voltage generation circuit 400, the comparator 406 receives either the first feedback voltage or both the first feedback voltage and the second feedback voltage at the first input terminal of the comparator 406. Regardless of whether the first feedback voltage or both the first feedback voltage and the second feedback voltage are received at the first input terminal, the comparator 406 compares the resulting input signal with the reference voltage (Vref). Based on the comparison, the comparator 406 outputs a control signal that is supplied to a control terminal of the charge pump circuit 402. Here, the comparator 406 indicates whether the feedback voltage provided to the input terminal is greater than or less than the reference voltage (Vref) plus/minus some small tolerance. The control signal serves to control the charge pump circuit 402 so that the output voltage (Vout) of the charge pump circuit 402 is regulated so as to attempt to maintain the output voltage at the regulated level even in the presence of loads being applied or removed from the output terminal of the charge pump circuit 402.

The voltage generation circuit 400 serves to regulate the output voltage (Vout) from the charge pump circuit 402 through use of the capacitive divider 404 as well as the resistive divider 408. In this embodiment, the capacitive divider 404 is active to produce a first feedback voltage. In addition, the resistive divider 408 is controlled so as to be active to regulate the output voltage to the regulation level. The first switch 410 and the second switch 412 are used to activate or deactivate the resistive divider 408. More particularly, the first and second switches 410 and 412 are "on" when the resistive divider 408 is active, and the first and second switches 410 and 412 are "off" when the resistive divider 408 is inactive.

Advantageously, the resistive divider 408 of the voltage generation circuit 400 can be enabled or disabled as appropriate. The first switch 410 is controlled to enable or disable the resistive divider 408. When enabled, the resistive divider 408 participates in the voltage regulation. The second feedback signal, when provided, will dominate the first feedback signal. In one embodiment, the capacitive divider 404 relies on conservation of charge to provide voltage regulation, and when the resistive divider 408 is enabled, charge conservation is not provided by the capacitive divider 404. When the resistive divider 408 is disabled, the resistive divider 408 is effectively isolated from participating in the voltage regulation such that it does not provide any feedback signal to the comparison circuit 406 (i.e., the second switch 412 provides such isolation). In this case, the first feedback voltage provided by the capacitive divider 404 is used to provide the regulation of the output voltage (Vout). Moreover, when the resistive divider 408 is disabled, the power consumed or dissipated by the resistive divider 408 is substantially reduced (or even eliminated). Accordingly, the voltage generation circuit 400 is capable of operating in an accurate, stable and reliable with substantially improved power efficiency.

Figure 5:
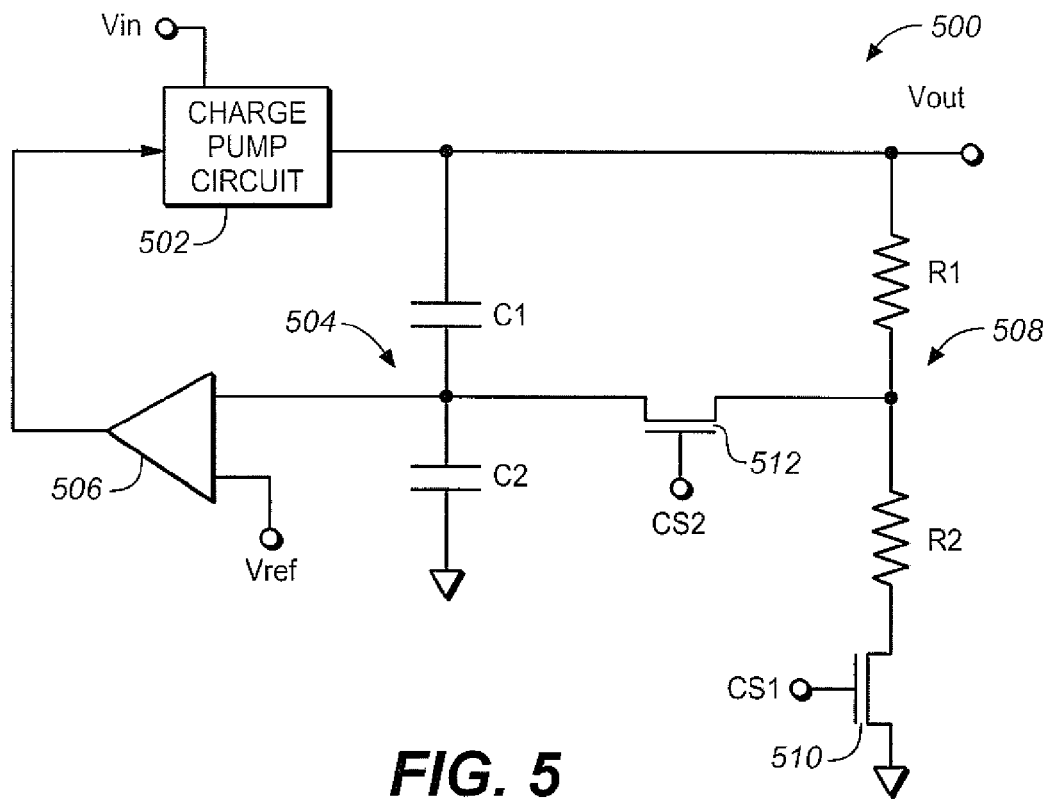
FIG. 5 is a schematic diagram of a voltage generation circuit according to still another embodiment of the invention.

FIG. 5 is a schematic diagram of a voltage generation circuit 500 according to still another embodiment of the invention. The voltage generation circuit 500 can represent an embodiment of the voltage generation circuit 400 discussed above with reference to FIG. 4.

The voltage generation circuit 500 includes a charge pump circuit 502. The charge pump circuit 502 receives an input voltage (Vin) and outputs a derived output voltage (Vout). The output voltage (Vout) can be higher or lower than the input voltage (Vin). The voltage generation circuit 500 also includes regulation circuitry (or feedback circuitry). In this embodiment, the regulation circuitry includes a capacitive divider 504, a comparator 506, and a resistive divider 508. The capacitive divider 504 includes a first capacitor C1 and a second capacitor C2 connected in series. The resistive divider 508 includes a first resistor R1 and a second resistor R2 connected in series. The voltage generation circuit 500 also includes a first switch 510 and a second switch 512. In one embodiment, the first switch 510 and the second switch 512 are active electronic devices. For example, the first switch 510 and the second switch 512 are transistors (e.g., MOSFET devices).

The capacitive divider 504 is coupled between an output terminal (providing the output voltage (Vout)) from the charge pump circuit 502 and ground. The capacitive divider 504 provides a first feedback voltage to a first input terminal of the comparator 506. In particular, a first node at the series connection of the capacitors C1 and C2 couples to the first input terminal of the comparator 506. A second input terminal of the comparator 506 receives a reference voltage (Vref). The resistive divider 508 is coupled between the output terminal of the charge pump circuit 502 and the first switch 510. A second node at the series connection of the resistors R1 and R2 couples to the second switch 512. The first switch 510 controls whether the resistor R2 of the resistive divider 508 couples to ground. The first switch 510 is controlled by a first control signal (CS1). The resistive divider 508 provides a second feedback voltage from the second node to the second switch 512. The second switch 512 controls whether the second node is coupled to the first node. In other words, the second switch 512 controls whether the second feedback voltage is supplied to the first input terminal of the comparator 506. The second switch 512 is controlled by a second control signal (CS2). The operation of the voltage generation circuit 500 is as described above with regard to the voltage generation circuit 400.

The operation of the voltage generation circuit 500 according to one embodiment of the invention is explained below. The voltage generation circuit 500, which uses a hybrid regulation scheme, can be considered to have an initialization phase and a maintenance phase. The hybrid regulation scheme makes use of a both a resistive divider feedback scheme and a capacitive divider feedback scheme.

In the initialization phase, voltage regulation is relies on the resistive divider feedback scheme provided by the resistive divider 508. During the initialization phase, the resistive divider 508 serves to provide voltage feedback so as to yield the output voltage (Vout) at an appropriate regulated level. During the initialization phase, the capacitive divider feedback being provided by the capacitive divider 504 can be considered essentially "off" since the feedback voltage provided to the comparator 506 is essentially set by the resistor divider 508. In this case, conservation of charge from the capacitive divider 504 does not hold the divided node of the capacitive divider 504.

After regulation is achieved, the maintenance phase can be entered. In the maintenance phase, the resistive divider 508 is shut off (disabled/deactivated) and de-coupled from the first node. At this point, regulation of the output voltage (Vout) relies on capacitive divider feedback provided by the capacitive divider 504. Here, conservation of charge at the divided node of the capacitive divider 504 holds the divided node of the capacitive divider 504. Accordingly, the regulation level is initially set by a resistive divider feedback scheme, but then maintained by a capacitive divider feedback scheme.

In the maintenance phase, the capacitive divider 504 samples the voltage change ($\Delta V$) on the output voltage (Vout). The sampled voltage being supplied to the comparator 506 is determined by the following equation.

$$\Delta V \frac{C1}{C1+C2}$$

The sampled voltage is compared with a reference voltage (Vref) at the comparator 506. The size of the capacitors C1 and C2 is not so critical since such only determine the coupling ratio, rather than determine the final regulation voltage level. As a result, the coupling ratio can be made substantially higher than what can be achieved with conventional capacitance or resistive feedback approaches.

For example, to get a 20 Volts (V) output voltage (Vout) with a reference voltage (Vref) of 1 V, using a resistive divider, the feedback voltage is determined as follows.

$$Vref \frac{R1+R2}{R2}$$

As a result, the resistance of the resistor R2 should be nineteen (19) times (19×) of the resistance of the resistor R1. The same applies for a capacitive divider. Namely, the feedback voltage for a capacitive divider is as follows.

$$Vref \frac{C2+C1}{C1}$$

Similarly, the capacitance of the capacitor C2 should be nineteen (19) times (19×) the capacitance of the capacitor C1. Consequently, for both conventional approaches, it should be noted that for any variation on the output voltage (Vout), only 5% of the variation ends up being compared with the reference voltage (Vref).

In contrast, for the hybrid regulation scheme according to one embodiment of the invention, the regulation level is set by a resistive divider and not by a capacitive divider. The capacitive divider operates in parallel only to determine the voltage change ($\Delta V$) near above or below the regulation level on the output voltage (Vout) for comparison with the reference voltage (Vref). Here, the sampled voltage is determined by the following equation.

$$Vout \frac{C1}{C1+C2}$$

If the capacitance of the capacitors C1 and C2 are of equal size, then the coupling ratio is 50%, which is ten (10) times higher than the conventional resistive or capacitive divider approach, provides for improved regulation.

One concern for using a capacitive divider for voltage feedback is its ability to conserve charge on the divided node (first node). This is a concern for any cases using a capacitive divider feedback scheme. More particularly, if the leakage on the divided node is large or if the charge loss on this node is significant over time, the final regulation level will undesirably change. The change will be based on the following equation.

$$\Delta V \frac{C1+C2}{C1}$$

As noted above, if the capacitance of the capacitor C1 is same as the capacitance of the capacitor C2, a 100 mV voltage change on divided voltage due to charge loss would cause a 200 mV error on the final regulation level. If capacitance of the capacitor C2 is nineteen (19) times (19×) the capacitance of the capacitor C1, the 100 mV voltage will cause 2 V error on the output regulation level. As such, the resistive divider can be re-initialized to again set the regulation level, and thus set the voltage on divided node. When to re-initialize the resistive divider depends on tolerance and time for a particular design. If different regulation levels are needed, re-initialization can also be used to acquire the desired regulation level via the resistor divider feedback scheme.

Figure 6:
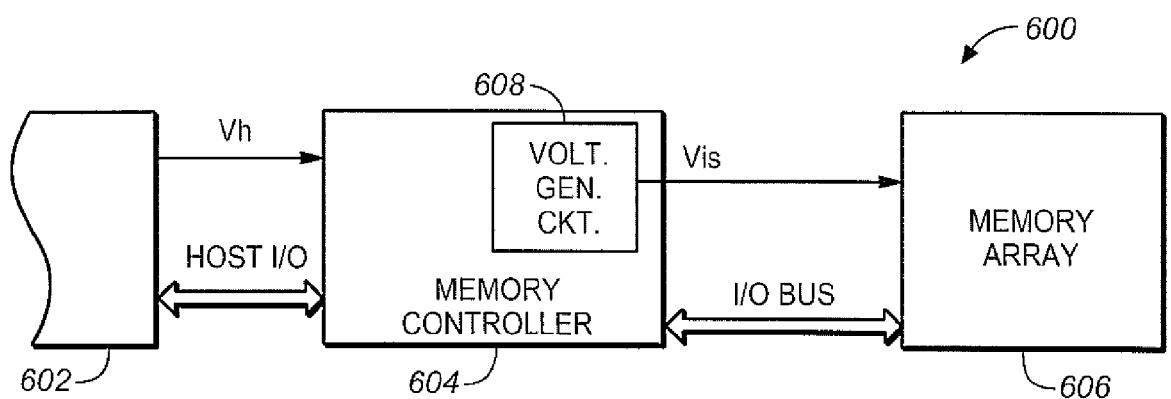
FIG. 6 is a block diagram of a memory system according to one embodiment of the invention.

FIG. 6 is a block diagram of a memory system 600 according to one embodiment of the invention. The memory system 600 is, for example, associated with a memory card (such as a plug-in card), a memory stick, or some other data storage product. Examples of a memory card include PC Card (formerly PCMCIA device), Flash Card, Flash Disk, Multimedia Card, and ATA Card. The memory system 600 can also be referred to as a memory product or a removable data storage product.

The memory system 600 cooperates with a host 602. For example, the host 602 can be a computing device, such as a personal computer. In particular, the memory system 600 stores data that can be utilized by the host 602. The memory system 600 and the host 602 can communicate over a host Input/Output (I/O) bus. The host 602 provides a host voltage (Vh) (i.e., supply voltage) to the memory system 600. The memory controller 604 couples to the host I/O bus and the host voltage (Vh). The memory controller 604 couples to a memory array 606 using an I/O bus and an internal supply voltage (Vis). The internal supply voltage (Vis) is generated by a voltage generation circuit 608 provided within the memory controller 604. The voltage generation circuit 608 can correspond to any of the voltage generation circuits discussed herein. For example, the voltage generation circuit 608 can correspond to the voltage generation circuits illustrated in FIGS. 3, 4 or 5.

The level of the voltages can vary with implementation. As one example, the host voltage (Vh) might be 3.3 or 1.8 volts, and the level of the internal supply voltage (Vis) might be 6.5 volts, 15 volts or 30 volts. Moreover, although the voltage generation circuit 608 is illustrated in FIG. 6 as being internal to the memory controller 604, in alternative embodiment, the voltage generation circuit 608 can be (i) internal to the memory array 606 or (ii) separate from either the memory controller 604 or the memory array 606.

The memory array 606 provides an array of data storage elements that provide non-volatile digital data storage. In one embodiment, the data storage elements are electrically programmable and electrically erasable, such as EEPROM or FLASH devices. For example, the data storage elements can be based on floating-gate devices. The memory array 606 can include one or more semiconductor dies, chips or products. The memory array 606 can include data storage elements. The memory controller 604 is also often a separate semiconductor die, chip or product.

Although the embodiment of the memory system 600 shown in FIG. 6 produces the internal supply voltage (Vis) at the memory controller 604, it should be understood that the memory controller 604 can produce any number of a plurality of different supply voltage levels that would be needed by the memory array 606.

Figure 7:
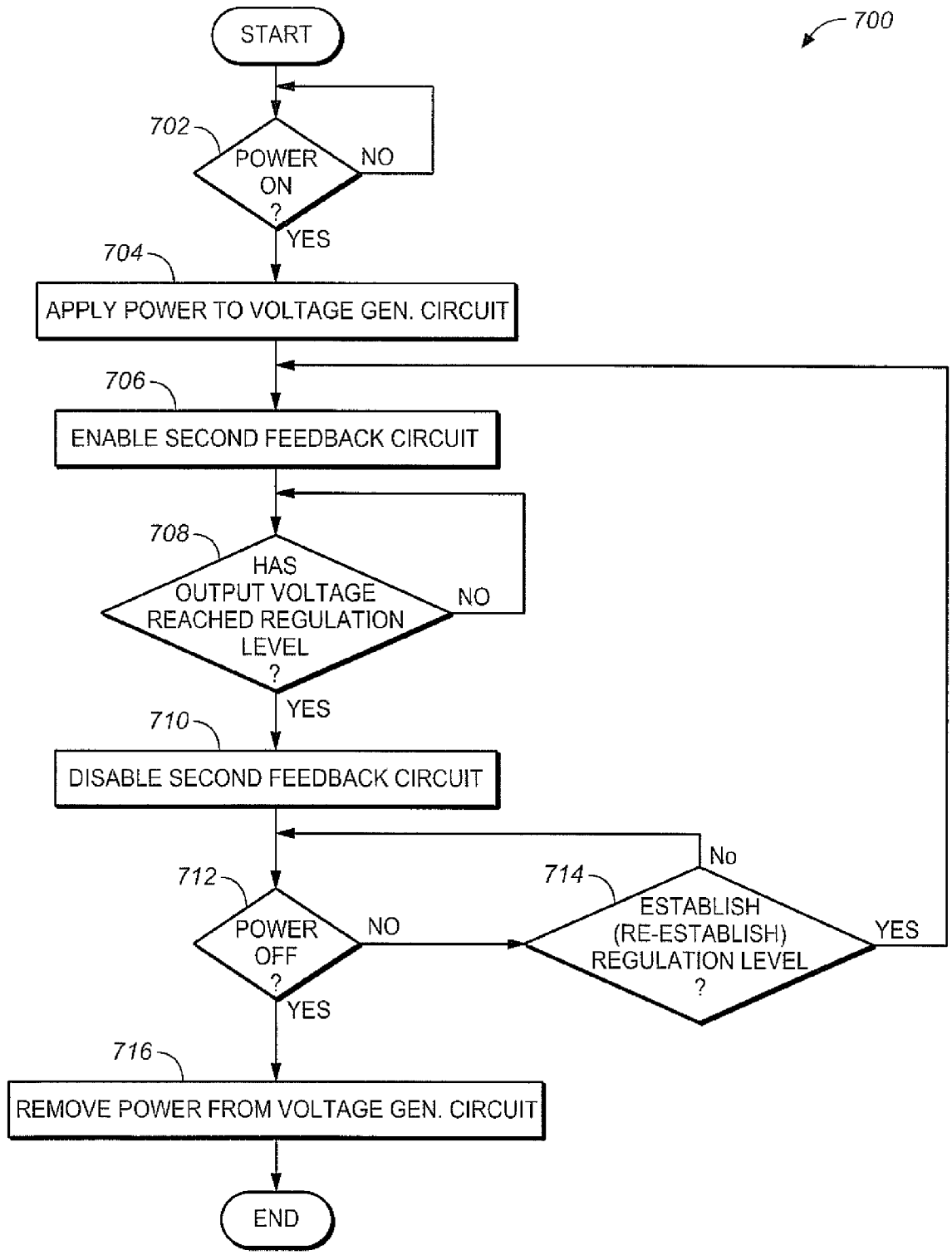
FIG. 7 is a flow diagram of a voltage regulation process according to one embodiment of the invention.

FIG. 7 is a flow diagram of a voltage regulation process 700 according to one embodiment of the invention. The voltage regulation process 700 is performed by a voltage generation circuit. For example, the voltage generation circuit can be the voltage generation circuit 300 illustrated in FIG. 3, the voltage generation circuit 400 illustrated in FIG. 4, or the voltage generation circuit 500 illustrated in FIG. 5.

The voltage regulation process 700 begins with a decision 702. The decision 702 determines whether a voltage generation circuit has been powered on. When the decision 702 determines that a voltage generation circuit is not powered on, the voltage regulation process 700 awaits the powering on of the voltage generation circuit. In other words, once power is applied to the voltage generation circuit, the voltage regulation process 700 can be invoked. Hence, when the decision 702 determines that the voltage generation circuit has been powered on, power is applied 704 to the voltage generation circuit. The voltage generation circuit includes a first feedback circuit as well as a second feedback circuit. It is assumed that the first feedback circuit is active (or enabled) when power is applied 704 to the voltage generation circuit. However, it is also assumed that the second feedback circuit is controllably activated (or enabled). Hence, when the power is applied 704 to the voltage generation circuit, the second feedback circuit is controlled so as to be actively enabled 706.

Next, a decision 708 determines whether the output voltage of the voltage generation circuit has reached its regulated level. When the decision 708 determines that the output voltage has not yet reached its regulated level, the voltage regulation process 700 waits until the output voltage has reached its regulated level. At this point, both the first and second feedback circuits are active and participating in the voltage regulation. However, in one embodiment, the second feedback circuit dominates the feedback process and is primarily responsible for causing the output voltage to regulate to its regulated level.

Once the decision 708 determines that the output voltage has reached its regulated level, the voltage regulation process 700 continues. At this point, the second feedback circuit is disabled 710. Although the second feedback circuit has been disabled 710, the voltage regulation provided by the voltage generation circuit continues through use of the first feedback circuit. Hence, the output voltage of the voltage generation circuit continues to be regulated to the regulated level by use of the first feedback circuit. With the second feedback circuit disabled 710, the power that the second feedback circuit would consume if still activated is substantially or completely conserved.

Next, a decision 712 determines whether the voltage generation circuit is to be powered off. When the decision 712 determines that the voltage generation circuit is not to be powered off, a decision 714 determines whether a regulation level needs to be established (or re-established). Here, the regulation level can be re-established as appropriate to insure accurate regulation. Alternatively, the regulation may be imposed to set a different level, such as would for example be commonplace with multi-level data storage devices. When the decision 714 determines that a regulation level is to be established (or re-established), the voltage regulation process 700 returns to repeat the block 706 and subsequent blocks so that the second feedback circuit can be again enabled and utilized to return the output voltage to an appropriate regulated level. In one embodiment, the first feedback circuit uses a capacitive divider which depends on charge conservation at its divided node to provide the voltage regulation. However, there can be current leakage at the semiconductor junction associated with the divided node. If the charge loss due to leakage is significant over time, deviation in the regulation level could undesirably occur. Hence, re-establishment of a regulation level can be performed as needed to maintain the proper regulation level despite any current leakage. The rate of re-establishment can be dependent on how error tolerant the implementation is to deviation in the regulation level.

Alternatively, when the decision 714 determines that a regulation level is not to be established (or re-established) at this time, the voltage regulation process 700 returns to repeat the decision 712. On the other hand, once the decision 712 determines that the voltage generation circuit is to be powered off, power is removed 716 from the voltage generation circuit. Following the block 716, the voltage regulation process 700 ends.

Figure 8A:
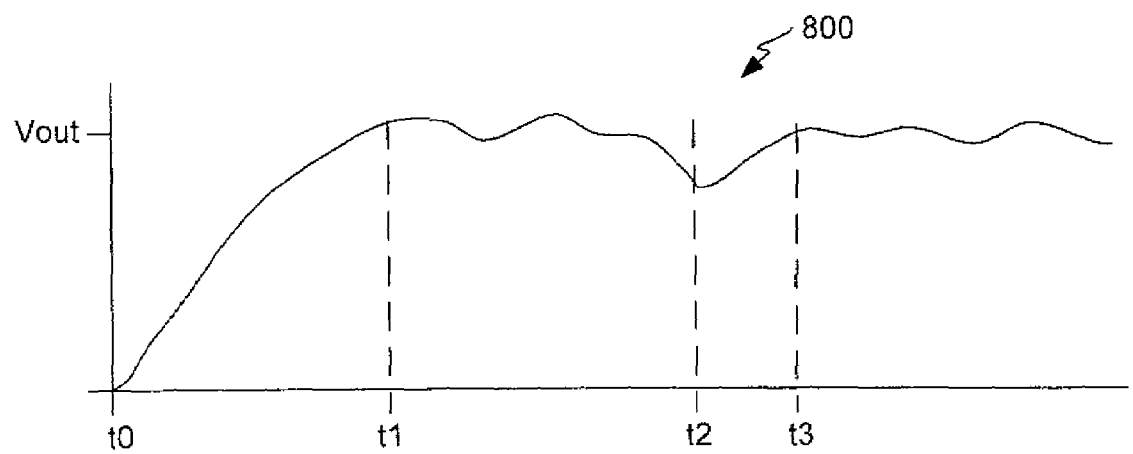
FIG. 8A is a graph illustrating a representative output voltage (Vout) from a voltage generation circuit according to one embodiment of the invention.
Figure 8B:
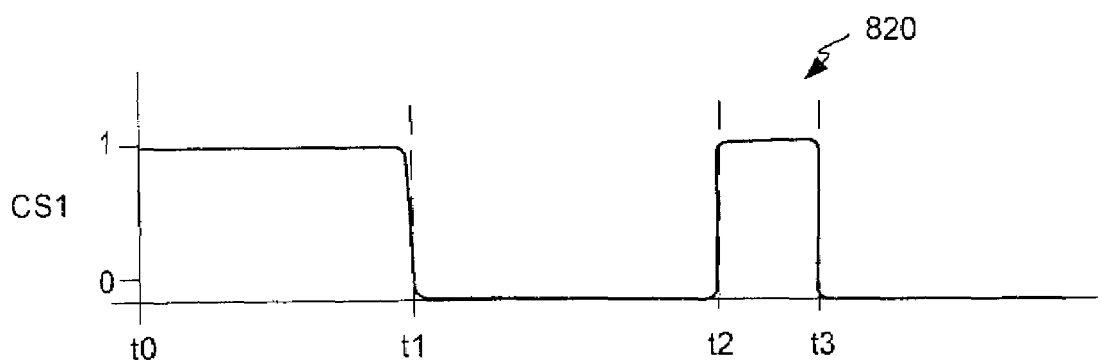
FIG. 8B illustrates a representative first control signal according to one embodiment of the invention.
Figure 8C:
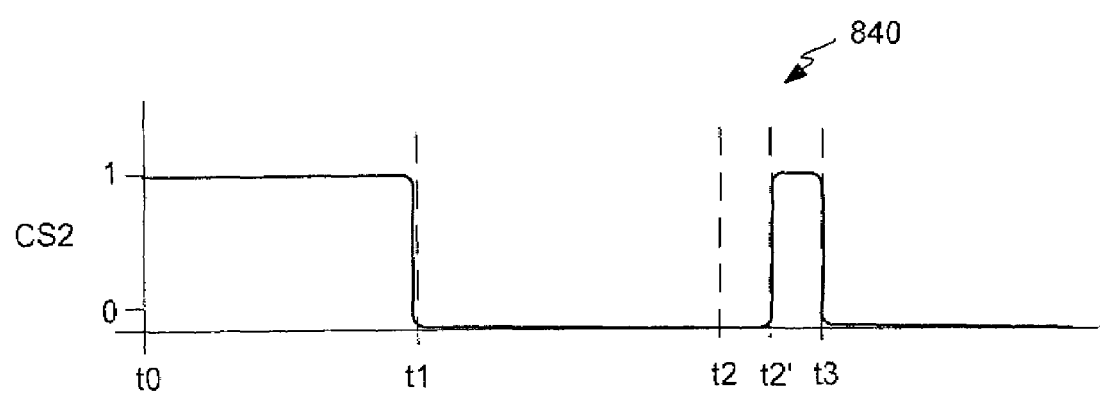
FIG. 8C illustrates a representative second control signal according to one embodiment of the invention.

FIGS. 8A-8C are views that illustrate an exemplary operation of a voltage generation circuit according to the invention. These views illustrate a representative output voltage together with corresponding control signals for activating and deactivating a portion of the voltage regulation circuitry.

FIG. 8A is a graph 800 illustrating a representative output voltage (Vout) from a voltage generation circuit according to one embodiment of the invention. The output voltage at time t0 is zero (0) Volts indicating that the voltage generation circuit is initially off. The voltage generation circuit is powered on at time t0 but takes a duration of time to boost its output voltage to its predetermined level. According to the invention, a first feedback circuit and a second feedback circuit can both be utilized starting at time t0. At time t1, the output voltage has reached the predetermined level. Therefore, load circuitry that is to utilize the output voltage can be initiated. In one embodiment, the load circuitry performs an operation over a period of time. For example, when the load is a memory device, the operation can be a program operation to store data to the memory device. In any case, at time t1 the second feedback circuit can be disabled since the output voltage has reached the predetermined level. As the load circuitry imposes different loads on the output voltage, the regulation of the output voltage can continue through use of the first feedback circuit. However, at time t2, it is assumed that there is a need to re-establish the regulation level that may have been diminished over time (e.g., due to charge leakage). Hence, the second feedback circuit can be enabled at time t2 so as to re-establish the regulation level and thus ensure that the output voltage reliably stays at the predetermined level with some tolerance. Subsequently, at time t3, the regulation level has been re-established; therefore, the second feedback circuit can again be disabled.

FIG. 8B illustrates a representative first control signal (CS1) 820 according to one embodiment of the invention. The first control signal 820 can be used to control a switch (e.g., switch 310, 410, 510) to activate or deactivate a feedback circuit (e.g., second feedback circuit or resistive divider). Here, it is assumed that the first control signal 820 is HIGH or logic level "1" to enable the feedback circuit, and LOW or logic level "0" to disable the feedback circuit. As shown in FIG. 8B, from time t0 to t1, the switch is activated ("ON") so that the feedback circuit is enabled. However, at time t1, the switch is deactivated ("OFF") so that the feedback circuit is disabled. Subsequently, at time t2, the switch is again activated ("ON") so that the feedback circuit is enabled. At time t3, the switch is deactivated ("OFF") so that the feedback circuit is disabled.

FIG. 8C illustrates a representative second control signal (CS2) 840 according to one embodiment of the invention. The second control signal 840 can be used to control a switch (e.g., switch 312, 412, 512) to couple or decouple a feedback signal from a feedback circuit (e.g., second feedback circuit or resistive divider) to a comparison circuit (e.g., comparator). Here, it is assumed that the second control signal 840 is HIGH or logic level "1" to couple the feedback signal, and LOW or logic level "0" to decouple the feedback signal. As shown in FIG. 8C, from time t0 to t1, the switch is activated ("ON") so that the feedback signal is coupled. However, at time t1, the switch is deactivated ("OFF") so that the feedback signal is decoupled. Subsequently, at time t2', the switch is again activated ("ON") so that the feedback circuit is coupled. At time t3, the switch is deactivated ("OFF") so that the feedback signal is decoupled. The time offset between time t2 and time t2' provides a delay so that the feedback circuit that produces the feedback signal can stabilize before being coupled to the comparison circuit through the switch.

The invention is suitable for use with both single-level memories and multi-level memories. The memories or memory blocks are data storage devices that include data storage elements. The data storage elements can be based on semiconductor devices (e.g., floating-gate) or other types of devices. In multi-level memories, each data storage element stores two or more bits of data.

The invention can further pertain to an electronic system that includes a memory system as discussed above. Memory systems (i.e., memory cards) are commonly used to store digital data for use with various electronics products. The memory system is often removable from the electronic system so the stored digital data is portable. The memory systems according to the invention can have a relatively small form factor and be used to store digital data for electronics products that acquire data, such as cameras, hand-held or notebook computers, network cards, network appliances, set-top boxes, hand-held or other small media (e.g., audio) players/recorders (e.g., MP3 devices), and medical monitors.

The advantages of the invention are numerous. Different embodiments or implementations may yield one or more of the following advantages. One advantage of the invention is that voltage regulation for charge pumps can be provided in an accurate, stable and power efficient manner. Another advantage of the invention is that regulation of an output voltage level can be provided such that the benefits of both capacitive dividers and resistive dividers can be obtained. Still another advantage of the invention is that low power, reliable, high performance memory systems can be obtained.

The many features and advantages of the present invention are apparent from the written description. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A voltage generation circuit, comprising:
a voltage producing circuit that receives an input voltage and outputs an output voltage at an output terminal, and the voltage producing circuit having a control terminal;
a comparison circuit operatively connected to the voltage producing circuit, the comparison circuit operating to compare a feedback signal received at an input terminal with a reference signal to produce a feedback signal that is supplied to the control terminal of the voltage producing circuit;
a first feedback circuit operatively connected to the output terminal of the voltage producing circuit and to the comparison circuit, the first feedback circuit providing a first feedback signal to the input terminal of the comparison circuit; and
a second feedback circuit operatively connected to the output terminal of the voltage producing circuit and to the comparison circuit, the second feedback circuit providing a second feedback signal to the input terminal of the comparison circuit, wherein the second feedback circuit can be enabled or disabled, whereby the voltage generation circuit operates with substantially reduced power when the second feedback circuit is disabled.

2. A voltage generation circuit as recited in claim 1, wherein the voltage generation circuit further comprises:
at least one switch to enable or disable operation of the second feedback circuit.

3. A voltage generation circuit as recited in claim 2, wherein the at least one switch comprises:
a first switch operatively connected between the second feedback circuit and a supply voltage; and
a second switch operatively connected between the second feedback circuit and the input terminal of the comparison circuit.

4. A voltage generation circuit as recited in claim 1, wherein the second feedback circuit can be enabled or disabled, whereby the second feedback circuit is decoupled from the comparison circuit when disabled.

5. A voltage generation circuit as recited in claim 4, wherein the voltage generation circuit further comprises:
at least one switch to enable or disable operation of the second feedback circuit.

6. A voltage generation circuit as recited in claim 4, wherein the voltage generation circuit operates with substantially reduced power when the second feedback circuit is disabled.

7. A voltage generation circuit as recited in claim 6, wherein the voltage generation circuit further comprises:
at least one switch to enable or disable operation of the second feedback circuit.

8. A voltage generation circuit as recited in claim 7, wherein the at least one switch comprises:
a first switch operatively connected between the second feedback circuit and a supply voltage; and
a second switch operatively connected between the second feedback circuit and the input terminal of the comparison circuit.

9. A voltage generation circuit as recited in claim 1, wherein the voltage generation circuit produces the output voltage for use in a memory product.

10. A voltage generation circuit as recited in claim 9, wherein the memory product is a portable memory device.

11. A voltage generation circuit, comprising:
a charge pump circuit that receives an input voltage and outputs an output voltage at an output terminal, the output voltage being derived from the input voltage, and the charge pump circuit having a control terminal;
a resistive divider operatively connected to the output terminal of the charge pump circuit to provide a first divided voltage at a first node;
a capacitor divider operatively connected to the output terminal of the charge pump circuit to provide a second divided voltage at a second node;
a comparator operatively connected to the second node and to a reference voltage, the comparator comparing the first divided voltage or the second divided voltage to the reference voltage to produce a first control signal that is supplied to the control terminal of the charge pump circuit;
a first switch operatively connected between the first node and the second node; and
a second switch operatively connected between the resistive divider and an established voltage.

12. A voltage generation circuit as recited in claim 11, wherein the resistive divider includes a plurality of resistors connected in series between the output terminal of the charge pump terminal and the second switch.

13. A voltage generation circuit as recited in claim 12, wherein the established voltage is ground.

14. A voltage generation circuit as recited in claim 12, wherein the capacitor divider includes a plurality of capacitors connected in series between the output terminal of the charge pump terminal and the established voltage.

15. A voltage generation circuit as recited in claim 11, wherein the second switch serves to prevent or substantially limit power consumption by the resistive divider when the second switch decouples the resistive divider from the established voltage.

16. A voltage generation circuit as recited in claim 11, wherein the resistive divider includes first and second resistors connected in series between the output terminal of the charge pump terminal and the second switch, and wherein the first node is a node connecting the first resistor and the second resistor.

17. A voltage generation circuit as recited in claim 16, wherein the capacitor divider includes a plurality of capacitors connected in series between the output terminal of the charge pump terminal and the established voltage, and wherein the second node is a node connecting the first capacitor and the second capacitor.

18. A voltage generation circuit as recited in claim 11, wherein the first switch and the second switch are both activated in a first phase of regulation of the output voltage by the charge pump circuit.

19. A voltage generation circuit as recited in claim 11, wherein the first switch and the second switch are both deactivated in a second phase of regulation of the output voltage by the charge pump circuit.

20. A voltage generation circuit as recited in claim 11, wherein, in a third phase of regulation, the first switch is initially activated, and subsequently the second switch is activated.

21. A voltage generation circuit as recited in claim 20, wherein the first switch is controlled by a first control signal to enable the resistor divider when regulation of the output voltage of the charge pump circuit is needed.

22. A voltage generation circuit as recited in claim 11, wherein the first switch includes at least a transistor, and wherein the second switch includes at least a transistor.

23. A memory product, comprising:
   data storage elements;
   a controller for performing data storage and retrieval with respect to the data storage elements; and
   at least one voltage generation circuit, the voltage generation circuit comprising:
   a charge pump circuit that receives an input voltage and outputs an output voltage at an output terminal, the output voltage being derived from the input voltage, and the charge pump circuit having a control terminal;
   a resistive divider operatively connected to the output terminal of the charge pump circuit to provide a first divided voltage at a first node;
   a capacitor divider operatively connected to the output terminal of the charge pump circuit to provide a second divided voltage at a second node;
   a comparator operatively connected to the second node and to a reference voltage, the comparator comparing the first divided voltage or the second divided voltage to the reference voltage to produce a first control signal that is supplied to the control terminal of the charge pump circuit;
   a first switch operatively connected between the first node and the second node; and
   a second switch operatively connected between the resistive divider and an established voltage.

24. A memory product as recited in claim 23, wherein the memory product is a memory card.

25. A memory product as recited in claim 23, wherein the data storage elements provide non-volatile data storage.

26. A memory product as recited in claim 23, wherein the data storage elements provide semiconductor-based data storage.

27. A memory product as recited in claim 26, wherein the data storage elements are EEPROM or FLASH.

28. A memory product as recited in claim 23, wherein each of the data storage elements comprise at least one floating-gate storage device.

29. A memory product as recited in claim 23, wherein the memory system is a removable data storage product.

30. A memory product as recited in claim 23, wherein the memory product is removably coupled to a host.

31. A memory system as recited in claim 30, wherein the host is a computing device.

32. A method for regulating a voltage level produced by a voltage generation circuit of a voltage control circuit, said method comprising:
   (a) activating the voltage control circuit that produces a regulated output voltage, the voltage control circuit including at least a first feedback circuit and a comparison circuit;
   (b) enabling a second feedback circuit;
   (c) determining whether the output voltage has reached its regulated level; and
   (d) disabling the second feedback circuit when said determining (c) determines that the output voltage has reached the regulated level, whereby regulation of the output voltage is through the second feedback circuit.

33. A method as recited in claim 32, wherein said method further comprises:
   (e) subsequently determining whether there regulation of the output voltage is to be again established;
   (f) enabling the second feedback circuit when said determining (e) determines that the regulation of the output voltage is to be again established;
   (g) determining whether the output voltage has returned to the regulated level; and
   (h) disabling the second feedback circuit when said determining (g) determines that the output voltage has returned to the regulated level.

* * * * *